United States Patent
Kawarabayashi

[11] Patent Number: 5,883,808
[45] Date of Patent: Mar. 16, 1999

[54] LOGIC CIRCUIT OPTIMIZATION APPARATUS AND ITS METHOD

[75] Inventor: Masamichi Kawarabayashi, Tokyo, Japan

[73] Assignee: NEC Corporation, Tokyo, Japan

[21] Appl. No.: 791,755

[22] Filed: Jan. 29, 1997

[30] Foreign Application Priority Data

Jan. 30, 1996 [JP] Japan ................................. 8-014049

[51] Int. Cl.$^6$ .................................................. G06F 17/50
[52] U.S. Cl. ........................................... 364/488; 364/578
[58] Field of Search ................................... 364/488, 489, 364/490, 491, 578

[56] References Cited

U.S. PATENT DOCUMENTS

| | | | |
|---|---|---|---|
| 5,095,454 | 3/1992 | Huang | 364/578 |
| 5,210,700 | 5/1993 | Tom | 364/489 |
| 5,353,433 | 10/1994 | Sherman | 364/488 |
| 5,365,463 | 11/1994 | Donath et al. | 364/578 |
| 5,461,576 | 10/1995 | Tsay et al. | 364/490 |
| 5,475,607 | 12/1995 | Apte et al. | 364/489 |
| 5,508,937 | 4/1996 | Abato et al. | 364/488 |
| 5,544,071 | 8/1996 | Keren et al. | 364/489 |
| 5,563,800 | 10/1996 | Matsumoto et al. | 364/489 |
| 5,581,738 | 12/1996 | Dombrowski | 364/488 |
| 5,636,372 | 6/1997 | Hathaway et al. | 364/491 |
| 5,726,902 | 3/1998 | Mahmood et al. | 364/489 |
| 5,778,216 | 7/1998 | Venkatesh | 364/488 |
| 5,790,435 | 8/1998 | Lewis et al. | 364/578 |
| 5,790,830 | 8/1998 | Segal | 364/488 |

FOREIGN PATENT DOCUMENTS

| | | |
|---|---|---|
| 4-51367 | 2/1992 | Japan . |
| 4-320575 | 11/1992 | Japan . |

OTHER PUBLICATIONS

Gutwin et al., "Delay Prediction for Technology-Independent Logic Equations", pp. 1–10.

*Primary Examiner*—Vincent N. Trans
*Attorney, Agent, or Firm*—Young & Thompson

[57] ABSTRACT

An optimization apparatus comprises a hierarchical circuit specification input for entering a logic circuit having a hierarchical structure, a delay constraint input for entering delay constraints of the logic circuit, a circuit database for storing and holding the logic circuit and delay constraint, a timing analyzer for performing the timing analysis of the logic circuit, a delay constraint distributor for distributing the delay constraints to each hierarchical configuring the logic circuit according to optimization possibility of the logic circuit, an optimizing unit for performing the delay optimization of the logic circuit according to the delay constraints distributed to the respective hierarchical sub-circuit of the logic circuit, a library input for entering library information to be used for the timing analysis of the logic circuit, a library database for holding the library information, and an output for outputting the optimized logic circuit.

14 Claims, 10 Drawing Sheets

LOGIC CIRCUIT OPTIMIZATION APPARATUS AND ITS METHOD

BACKGROUNDS OF THE INVENTION

1. Field of the Invention

The present invention relates to a logic circuit optimization apparatus and its method, and more particularly to a logic circuit optimization apparatus and its method for optimizing the delay of a logic circuit having a hierarchical structure.

2. Description of the Related Art

In designing a logic circuit, an optimization apparatus using a computer system is used to optimize the logic circuit in order to improve the performance of the logic circuit to be designed. In connection with a logic circuit having a hierarchical structure, there has been proposed a method for optimizing the delay of a path which extends over the hierarchical sub-circuits of a logic circuit.

Conventional types of such an optimizing technique include the one disclosed in, e.g., Japanese Patent Laid-open Publication (Kokai) No. Heisei 4-51367 "Logic Circuit Synthesizing Device". FIG. 8 shows the configuration of a conventional logic circuit optimizing apparatus disclosed in the above publication. It is seen from FIG. 8 that the logic circuit optimizing apparatus disclosed in the above publication comprises a hierarchical circuit specification input 110 for entering a logic circuit to be optimized having a hierarchical structure, a delay constraints input 120 for entering delay constraint of the pertinent logic circuit, a circuit database 130 for storing the entered logic circuit and delay constraints, a timing analyzer 140 for performing the timing analysis of the logic circuit held in the circuit database 130, an optimization unit 160 for optimizing the delay according to the prescribed delay constraints, a library input 170 for entering a target library of the logic circuit, a library database 180 for holding the entered library information, and an output 190 for outputting the optimized logic circuit.

The above-described optimization apparatus will be described on its operation. First, the hierarchical circuit specification input 110 enters a logic circuit to be optimized to store in the circuit database 130. The delay constraints input 120 enters delay constraints values which contain clock information, arrival times of signals at the input terminals of a hierarchical sub-circuit, and required times for signals at the output terminals of the hierarchical sub-circuit for the whole circuit or each hierarchical sub-circuit to add to the logic circuit stored in the circuit database 130. According to the clock information such as a rise time, a fall time and a cycle time, the arrival time of the signal (output signal) at the output terminal and the required time of the signal (input signal) at the input terminal can be calculated in view of a setup time and hold time of a storage device such as DFF which performs cycle operation on a prescribed clock.

Then, the library input 170 enters library data which contains information to be used for the timing analysis of respective blocks in a target library and stores in the library database 180. And, the timing analyzer 140 performs the timing analysis of the entire circuit. In view of convenience for describing, the maximum delay time only will be described, but the same procedure can be applied for the minimum delay time.

The timing analysis is performed as follows.

With respect to the arrival time determined for an output pin (hereinafter referred to as the starting point of a circuit) of the input terminal of a hierarchical sub-circuit or the storage device, an internal delay time of the block referring to a lower hierarchical sub-circuit or a primitive device block on the path to which a signal included in the circuit and the wiring delay time of wiring between the blocks are added with reference to the library database 180. And, for each output pin, the maximum a delay time from each input pin is determined as the arrival time at the output pin of the block. The propagation processing on the above-described arrival time is repeated until arriving at the input pin (hereinafter referred to as the end point of circuit) of the output terminal or storage device of the hierarchical sub-circuit. Thus, the time of arrival is determined for the output pin of each block.

If a block is mapped into the target library, the internal delay and wiring delay of the pertinent block are obtained according to a value which can be calculated by combining a state of the circuit and the stored value in the library with reference to the library database 180. And, if a block is not mapped, the delay can be predicted in view of the number of logic stages, or the internal delay and wiring delay time of the block can be predicted according to the complexity and fan-out of logic at the time when a combinational circuit is expressed in a logic equation. A method of predicting based on the complexity of logic and the fan-out is described in a literature, e.g., "Delay Prediction for Technology-Independent Logic Equations" (1992, TAU92 Proceeding).

Then, the required time is propagated in the direction opposite from the propagation of the arrival time. With respect to the required time set at the end of circuit, the internal delay time of the primitive device block on the path to which the signal in the circuit reaches or the block referring to the lower hierarchical sub-circuit and the delay wiring time between blocks are deducted, and the time of requirement is determined to the input pin and output pin of the blocks. The above-described propagation processing of the required time is repeated until arriving at the start point of the circuit. The internal delay of the lower hierarchical sub-circuit can be calculated by performing the timing analysis recursively in the same way.

A difference between the required time and the arrival time calculated as described above is called a slack. A partial circuit with a negative value of slack does not satisfy the delay constraint. In such a partial circuit, a column of blocks from the start to end of the circuit is called a critical path. A path having the slack consisting of smallest blocks is called a maximum critical path. The above description has been made on a case of calculating the maximum delay time. To calculate the minimum delay time, the minimum value of the delay time from each input pin for each output pin is determined as the arrival time at the output pin of the block and propagated.

After performing the timing analysis as described above, the optimizing unit 160 changes the circuit to make the delay of the critical path short and stores in the circuit database 130. When the slacks on all paths become a positive value, it means that the constraint is satisfied. The logic circuit undergone the optimization process is outputted from the output 190.

Normally, when a logic circuit, particularly a large scale circuit such as an LSI, is designed, the logic circuit is divided according to particular partial functions into a hierarchy. FIG. 9 shows an example of the logic circuit designed to have a hierarchical sub-circuit. It is seen from FIG. 9 that a top circuit 901 indicates the whole body of a logic circuit to be designed, in which lower reference hierarchical sub-circuits 902, 903 are referred to. A definition hierarchical sub-circuit 904 of the lower reference hierarchical sub-circuit 902 refers to low order reference hierarchical sub-circuits 905, 906. A definition hierarchical sub-circuit 907 of the lower reference hierarchical sub-circuit 905 is a least significant hierarchical sub-circuit and configured of a primitive device block only. And, there is no lower reference hierarchical sub-circuit.

The logic circuit is designed in the form of a hierarchical sub-circuit because a partial circuit can be designed and verifying for each particular function with respect to a large-scale logic circuit, designing efficiency can be improved, another designer can work on each partial circuit in parallel, a designing period can be made short, and a time required for logic synthesis can be made short. In a case of designing a logic circuit by using a logic synthesis system, when it is assumed that the calculation complexity of an optimization algorithm is proportional with the n-th power of the number of elements, it is generally known that n is larger than 1 in various optimization algorithms. In other words, by dividing to partial circuits, the circuit scale to be processed one time is made small and the number of elements is decreased, so that a total processing time can be made short.

Here, it is assumed that there is a combinational circuit having a path which extends over hierarchical sub-circuits as shown in FIG. 10. Lower hierarchical sub-circuits 1002, 1003 are within a higher hierarchical sub-circuit 1001, DFF 1004 and combinational circuits 1005, 1006 are within the lower hierarchical sub-circuit 1002, and DFF 1009 and combinational circuits 1007, 1008 are within the lower hierarchical sub-circuit 1003. The output pin of DFF 1004 becomes the start point of the path, and after getting out of the hierarchical sub-circuit 1002 via the combinational circuits 1005, 1006, enters the hierarchical sub-circuit 1003, and reaches the input pin which is the end point of DFF 1009 via the combinational circuits 1007, 1008.

In order to simplify the model, the setup hold time, clock skew, distinction between rising and falling, maximum delay, minimum delay and wiring delay time of DFF 1004, 1009 are disregarded. It is assumed that the delay times of respective combinational circuits from 1005 to 1008 are 1 ns, 2 ns, 2 ns and 4 ns, respectively. When the arrival time of the output pin of DFF 1004 is 0 ns and the required time of the input pin of DFF1009 is 6 ns, the arrival time at the output pins of the combinational circuits 1005 to 1008 become 1 ns, 3 ns, 5 ns and 9 ns, respectively. All slacks on this path have −3 ns, and the hierarchical sub-circuits 1002, 1003 have the same delay constraint of −3 ns determined with respect to this path. Since the optimization of delay is performed on each hierarchical sub-circuit, when it is assumed that the hierarchical sub-circuit 1004 is optimized first for example, it is regarded that the delay constraint of the path can be satisfied if shortening of 3 ns can be completed by only the hierarchical sub-circuit 1004 because the constraint of minimizing the delay by 3 ns has been determined. In other words, the hierarchical sub-circuit 1002 is not required to be optimized.

As described above, the conventional optimizing technique, which optimizes the delay of a path which extends over hierarchical sub-circuits of a logic circuit, optimizes each hierarchical sub-circuit without considering the possibility of optimizing delay, resulting in optimization with very poor balance depending on the order of selecting hierarchical sub-circuits to be optimized in view of the entire path. Therefore, it has disadvantages that the logic circuit has a large area, and the execution time becomes long because the optimization is repeated.

As to a logic circuit having a hierarchical structure, another optimizing technique for optimizing a delay of a path which extends over hierarchical sub-circuits of a logic circuit is disclosed in, e.g., Japanese Patent Laid-Open Publication (Kokai) No. Heisei 4-320575 "Logic Synthesizing Method and Its Apparatus". The apparatus in this publication has a hierarchy expanding unit for expanding hierarchical type logic circuit information into expansion type logic circuit information, a logic optimizing unit and a hierarchical sub-circuit restoring unit for converting the optimized expansion type logic circuit information into hierarchical type logic circuit information, expands the hierarchical sub-circuit prior to the optimization, optimizes the delay of each critical path, and restores to the original hierarchical structure after completing the optimization. Thus, the critical path can be optimized in good balance with good efficiency without a large area overhead.

However, since the expansion of the hierarchical structure of a logic circuit makes the circuit to be optimized large in size, it takes a long time to complete the optimization. And, it may sometimes happen as a result of optimization that the blocks in the boundary of hierarchical sub-circuits disappear and the terminal of the original hierarchical sub-circuit cannot be restored.

SUMMARY OF THE INVENTION

It is an object of the present invention to remedy the above-described disadvantages and to provide an optimizing apparatus which can perform an optimization in good balance according to the structure of a logic circuit and a method therefor.

In addition to the above object, it is another object of the present invention to provide an optimizing apparatus which can perform an optimization in good balance without expanding the hierarchical structure of a logic circuit and a method therefor.

According to the first aspect of the invention, an optimization apparatus for optimizing a logic circuit having a hierarchical structure, comprises a hierarchical circuit specification input means for entering a logic circuit having a hierarchical structure;

a delay constraint input means for entering a delay constraint which is provided by prescribed information indicating the constraint condition of delay time in the entered logic circuit;

a circuit database means for storing and holding the entered logic circuit and delay constraints;

a timing analysis means for performing the timing analysis of said logic circuit held by said circuit database means;

a delay constraint distribution means for distributing said delay constraints to respective hierarchical sub-circuits configuring said logic circuit according to the optimization possibility of said logic circuit held by said circuit database means;

an optimization means for performing the delay optimization of said logic circuit according to said delay constraints which is distributed to the respective hierarchical sub-circuits of said logic circuit by said delay constraint distribution means;

a library input means for entering library information to be used for the timing analysis of said logic circuit;

a library database means for holding the entered library information; and an output means for outputting the optimized logic circuit.

In the preferred construction, the delay constraint distribution means selects paths in order of their increasing slacks from the paths configuring the logic circuit or its partial circuit to be processed, determines the optimization possibility of combinational circuits on said paths, and determines the delay constraint for each of said combinational circuits according to said optimization possibility.

In the preferred construction, the delay constraint distribution means selects paths sequentially under prescribed conditions from the paths configuring the logic circuit or its partial circuit to be processed, determines the optimization possibility of a combinational circuit on said paths, takes into account the relation between an increase ratio of the circuit area and a delay time to be decreased when said combinational circuit is optimized, and determines the delay constraints so that the increase of said circuit area becomes minimum.

In another preferred construction, the delay constraint distribution means distributes said delay constraints to the respective hierarchical sub-circuits and wiring configuring said logic circuit, and said optimization means optimizes said logic circuit for the respective hierarchical sub-circuits and also minimizes the delay time of wiring between said hierarchical sub-circuits according to a floor plan which shows a layout of the respective hierarchical sub-circuits configuring said logic circuit.

In another preferred construction, the delay constraint distribution means selects paths in order of their increasing slacks from the paths configuring the logic circuit or its partial circuit to be processed, determines the optimization possibility of combinational circuits on said paths, determines the delay constraints for each of said combinational circuits according to said optimization possibility, and determines the delay constraint on the wiring between the combinational circuits and between the hierarchical sub-circuits according to a floor plan which shows a layout of the respective hierarchical sub-circuits configuring said logic circuit; and the optimization means optimizes said logic circuit for the respective hierarchical sub-circuits and also minimizes the delay time of wiring between said hierarchical sub-circuits according to said floor plan.

In the above-mentioned construction, the delay constraint distribution means selects paths sequentially under prescribed conditions from the paths configuring the logic circuit or its partial circuit to be processed, determines the optimization possibility of combinational circuits on said paths, takes into account the relation between an increase ratio of the circuit area and a delay time to be decreased when said combinational circuits are optimized, determines the delay constraint so that the increase of said circuit area becomes minimum, and determines the delay constraint on the wiring between the combinational circuits and between the hierarchical sub-circuits according to a floor plan which shows a layout of the respective hierarchical sub-circuits configuring said logic circuit; and the optimization means optimizes said logic circuit for the respective hierarchical sub-circuits and also minimizes the delay time of wiring between said hierarchical sub-circuits according to said floor plan.

According to the second aspect of the invention, an optimization method for optimizing a logic circuit having a hierarchical structure, comprising the steps of:

a first step to enter a logic circuit having a hierarchical structure;

a second step to enter delay constraints given by prescribed information which shows the constraint conditions of delay time in the entered logic circuit;

a third step to perform a timing analysis of said entered logic circuit;

a fourth step to distribute said delay constraints to the respective hierarchies configuring said logic circuit according to the optimization possibility of said entered logic circuit;

a fifth step to perform the delay optimization of said logic circuit according to said delay constraint which is delivered to the respective hierarchical sub-circuits of said logic circuit; and a sixth step to output the logic circuit which has been optimized.

In the preferred construction, the third step for distributing said delay constraints comprise a step to take out by selecting paths in order of their increasing slacks from the paths configuring the logic circuit or its partial circuit to be processed; a step to determine whether or not the optimization possibility has been set for the combinational circuits on said taken paths; a step to determine the optimization possibility when the optimization possibility has not been set for said combinational circuits; and a step to determine a delay constraint for each of said combinational circuits according to said optimization possibility.

In the preferred construction, the third step for distributing said delay constraint comprises a step to take out by selecting paths sequentially under arbitrary conditions from the paths configuring the logic circuit or its partial circuit to be processed; a step to determine whether or not the optimization possibility has been set for the combinational circuits on said taken paths; a step to determine the optimization possibility when the optimization possibility has not been set for said combinational circuits; and a step to take into account the relation between an increase ratio of the circuit area and a delay time to be decreased when said combinational circuits are optimized, and to determine the delay constraints so that the increase of said circuit area becomes minimum.

According to the third aspect of the invention, an optimization method for optimizing a logic circuit having a hierarchical structure, comprising the steps of:

a first step to enter a logic circuit having a hierarchical structure;

a second step to enter delay constraints given by prescribed information which shows the constraint conditions of delay time in the entered logic circuit;

a third step to perform a timing analysis of said entered logic circuit;

a fourth step to distribute said delay constraints to the respective hierarchical sub-circuits and respective wiring configuring said logic circuit according to the optimization possibility of said entered logic circuit;

a fifth step to perform the delay optimization of said logic circuit according to said delay constraints which is delivered to the respective hierarchies of said logic circuit; and a sixth step to output the logic circuit which has been optimized.

In the above-mentioned construction, the third step for distributing said delay constraint comprises a step to take out by selecting paths in order of their increasing slacks from the paths configuring the logic circuit or its partial circuit to be processed; a step to determine whether or not the optimization possibility has been set for the combinational circuits and wiring on said taken paths; a step to determine the optimization possibility when the optimization possibility has not been set for said combinational circuits or said wiring; and a step to determine delay constraints for each of said combinational circuits according to said optimization possibility.

In the above-mentioned construction, the third step for distributing said delay constraints comprises a step to take out by selecting paths sequentially under arbitrary conditions from the paths configuring the logic circuit or its partial circuit to be processed; a step to determine whether or not the optimization possibility has been set for the combinational circuits and respective wiring on said taken paths; a step to determine the optimization possibility when the optimization possibility has not been set for said combinational circuits or said wiring; and a step to take into account the relation between an increase ratio of the circuit area and a delay time to be decreased when said combinational circuits and said wiring are optimized, and to determine the delay constraint so that the increase of said circuit area becomes minimum.

According to a further aspect of the invention, a computer readable memory having a computer program for directing a computer to optimize a logic circuit having a hierarchical structure, said computer program comprising the steps for controlling the computer to:

enter a logic circuit having a hierarchical structure;

enter a delay constraint given by prescribed information which shows the constraint conditions of delay time in the entered logic circuit;

perform a timing analysis of said entered logic circuit;

distribute said delay constraints to the respective hierarchies configuring said logic circuit according to the optimization possibility of said entered logic circuit;

perform the delay optimization of said logic circuit according to said delay constraints which is delivered to the respective hierarchical sub-circuits of said logic circuit; and output the logic circuit which has been optimized.

In this case, the step for distributing said delay constraints comprising the steps of:

take out by selecting paths sequentially under arbitrary conditions from the paths configuring the logic circuit or its partial circuit to be processed;

determine whether or not the optimization possibility has been set for the combinational circuits on said taken paths;

determine the optimization possibility when the optimization possibility has not been set for said combinational circuits; and take into account the relation between an increase ratio of the circuit area and a delay time to be decreased when said combinational circuits are optimized, and to determine the delay constraints so that the increase of said circuit area becomes minimum.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENTS

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
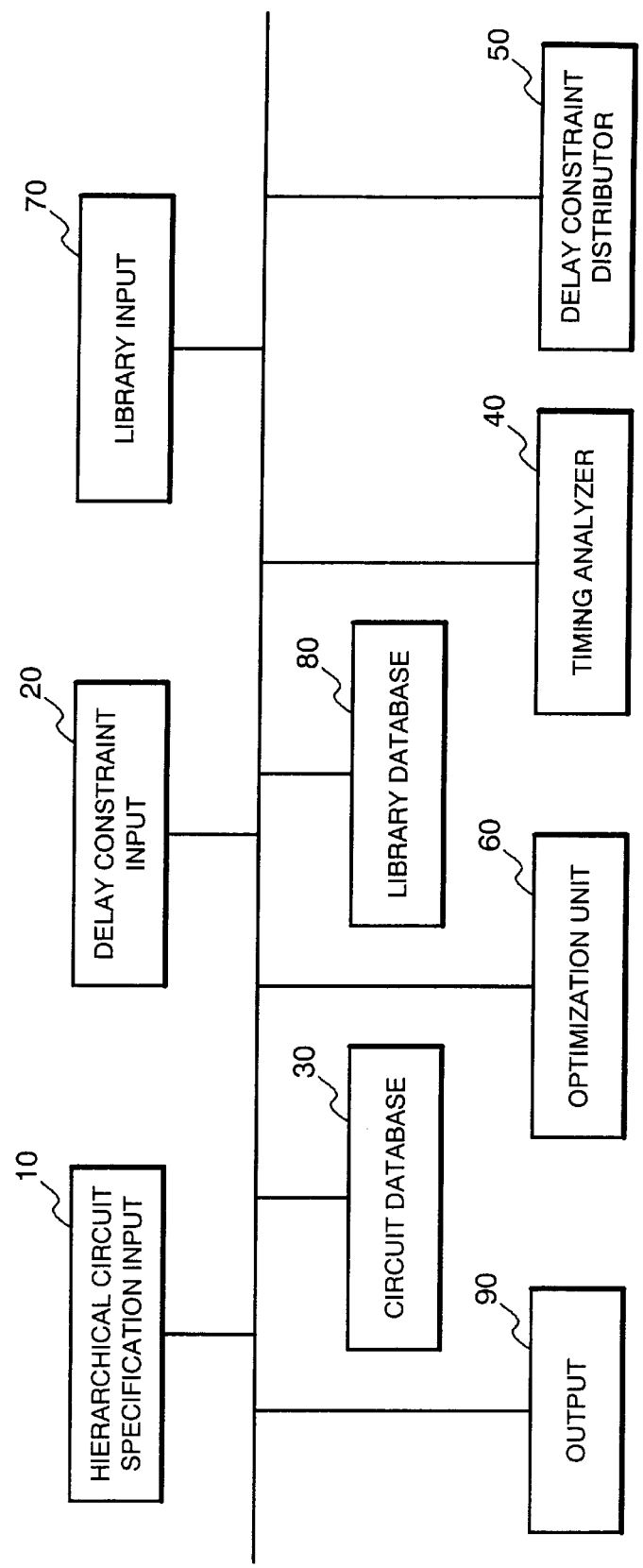
FIG. 1 is a block diagram showing a configuration of the logic circuit optimization apparatus according to a first embodiment of the present invention.

FIG. 1 is a block diagram showing a configuration of the logic circuit optimization apparatus according to a first embodiment of the present invention.

It is seen from FIG. 1 that the optimization apparatus according to this embodiment comprises a hierarchical circuit specification input 10 for entering a logic circuit to be optimized having a hierarchical structure, a delay constraint input 20 for entering delay constraint of the pertinent logic circuit, a circuit database 30 for storing the entered logic circuit and delay constraint, a timing analyzer 40 for performing the timing analysis of the logic circuit held in the circuit database 30, a delay constraint distributor 50 for distributing the delay constraints to each hierarchical sub-circuit according to optimization possibility, an optimizing unit 60 for optimizing the delay according to predetermined delay constraints, a library input 70 for entering a target library of the logic circuit, a library database 80 for holding the entered library information, and an output 90 for outputting the optimized logic circuit. FIG. 1 shows only the characteristic structure of this embodiment and omits other general structures.

In the above structure, the hierarchical circuit specification input 10, the delay constraint input 20 and the library input 70 are achieved by a program-controlled CPU, an appropriate interface, and an input device. The circuit database 30 and the library database 80 are achieved by a prescribed external storage device (e.g., a magnetic disk drive) and an internal storage device (e.g., RAM). The timing analyzer 40, the delay constraint distributor 50 and the optimizing unit 60 are achieved by a program-controlled CPU. The output 90 is achieved by an appropriate interface and output device.

Figure 2:
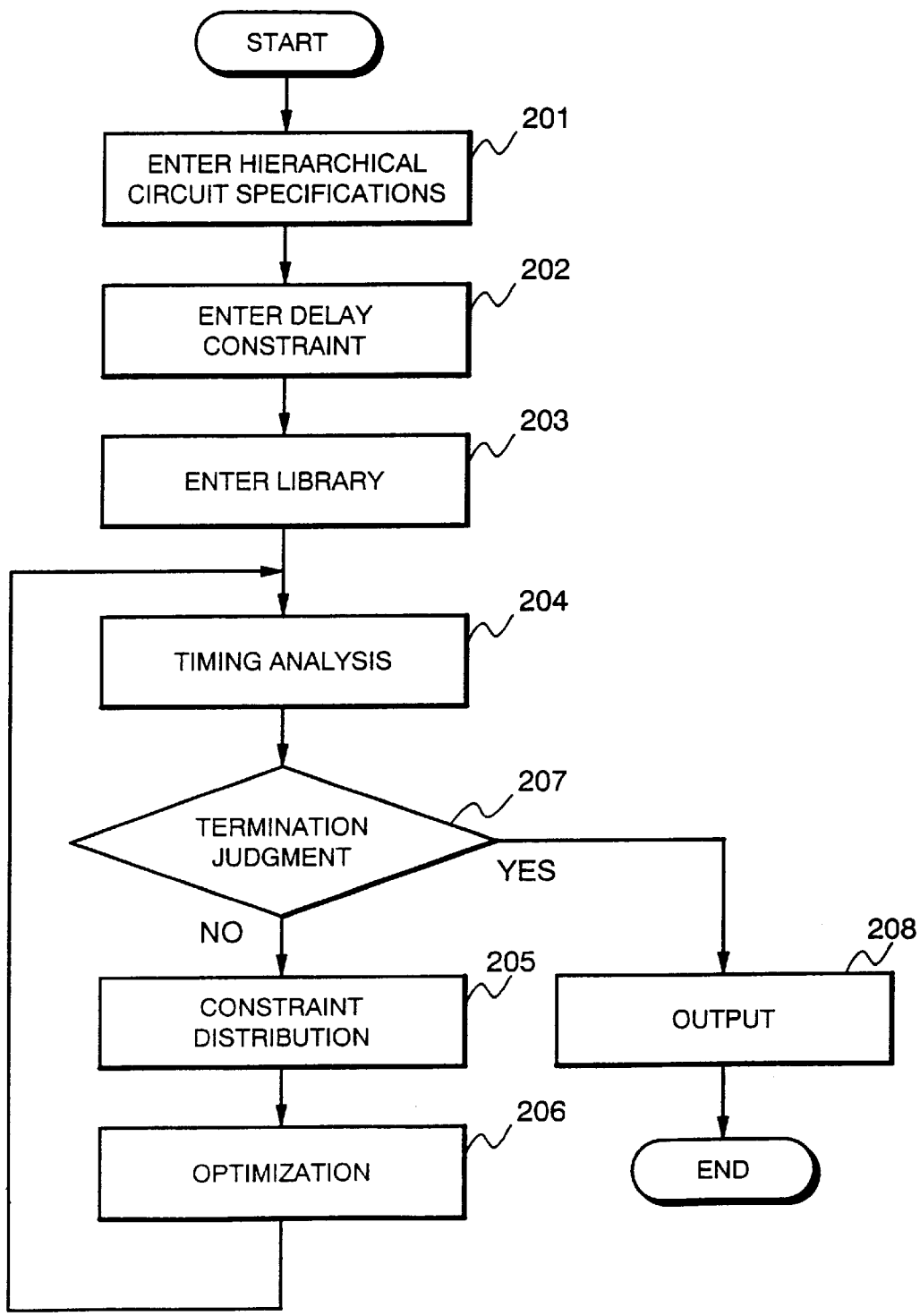
FIG. 2 is a flowchart showing the optimization processing according to the embodiment.

The operation of this embodiment will be described with reference to the flowchart shown in FIG. 2.

First, the hierarchical circuit specification input 10 enters all or a part of a logic circuit to be optimized as hierarchical specification (hereinafter referred to as the logic circuit unless otherwise specified) to store in the circuit database 30 (step 201). The logic circuit to be entered may be written in a hardware description language (HDL) at a register transfer (RT) level or a net list at a gate level.

The delay constraint input 20 adds a delay constraint value given by prescribed information containing clock information, an arrival time of a signal to an input terminal and a required time for a signal at an output terminal to a to-be-optimized logic circuit stored in the circuit database 30 (step 202). In the same way as the conventional one, according to the clock information containing a rise time, a fall time and a cycle of the clock signal, the arrival time of the signal (output signal) at the output pin and the required time of the signal (input signal) at the input pin can be calculated in view of a setup time and hold time of a storage device such as DFF which performs cycle operation on the pertinent clock.

Then, the library input 70 enters information which is used for the timing analysis of respective blocks in a target library and stores in the library database 80 (step 203).

And, the timing analyzer 40 performs the timing analysis of the logic circuit stored in the circuit database 30 (step 204). In view of convenience for describing, the maximum delay time only will be described. With respect to the arrival time determined for the start point of the circuit, an internal delay time of the block referring to a lower hierarchical sub-circuit or a primitive device block on the path to which a signal included in the circuit reaches and the delay time of wiring between the blocks are added with reference to the library database 80. And, for each output pin, the maximum value of a delay time from each input pin is determined as the arrival time at the output pin of the block. The propagation processing on the above-described arrival time is repeated until arriving at the end point of the circuit. Thus, the arrival time is determined for the output pin of each block.

If a block has been mapped into a specific target library, the internal delay and wiring delay of the pertinent block are obtained according to a value which can be calculated by combining a state of the circuit and the stored value in the library with reference to the library database 180. And, if a block has not been mapped, a delay time is predicted by a method which predicts a delay in view of the number of logic stages or a method which predicts the internal delay and wiring delay of the block based on the complexity of logic and the fan-out when a combinational circuit is expressed in a logic equation, as described above.

Then, the required time is propagated in the direction opposite from the propagation of the arrival time. With respect to the required time set at the end point of circuit, the internal delay time of the primitive device block on the path to which the signal in the circuit reaches or the block referring to the lower hierarchical sub-circuit and the delay time of the wiring between blocks are deducted, and the required time is determined to the input pin and output pin of the blocks. The above-described propagation processing of the required time is repeated until arriving at the start point of circuit. The internal delay of the lower hierarchical sub-circuit can be calculated by performing the timing analysis recursively in the same way. The above description has been made on the calculation of the maximum delay time, but the same procedure excepting that the propagation of the minimum delay time is different can be applied to calculate the minimum delay time.

After completing the above timing analysis, the timing analyzer 40 judges the termination (step 207). Specifically, if the timing analysis results in that the slacks of all paths are not negative, it means that there are no constraint violating paths, and the processing goes to the output 90 (step 208). On the other hand, if there is a path having a negative value of slack, it indicates that the pertinent path has a constraint violating portion. Then, if there is an allowance of optimizing, the following processing is continued.

Figure 3:
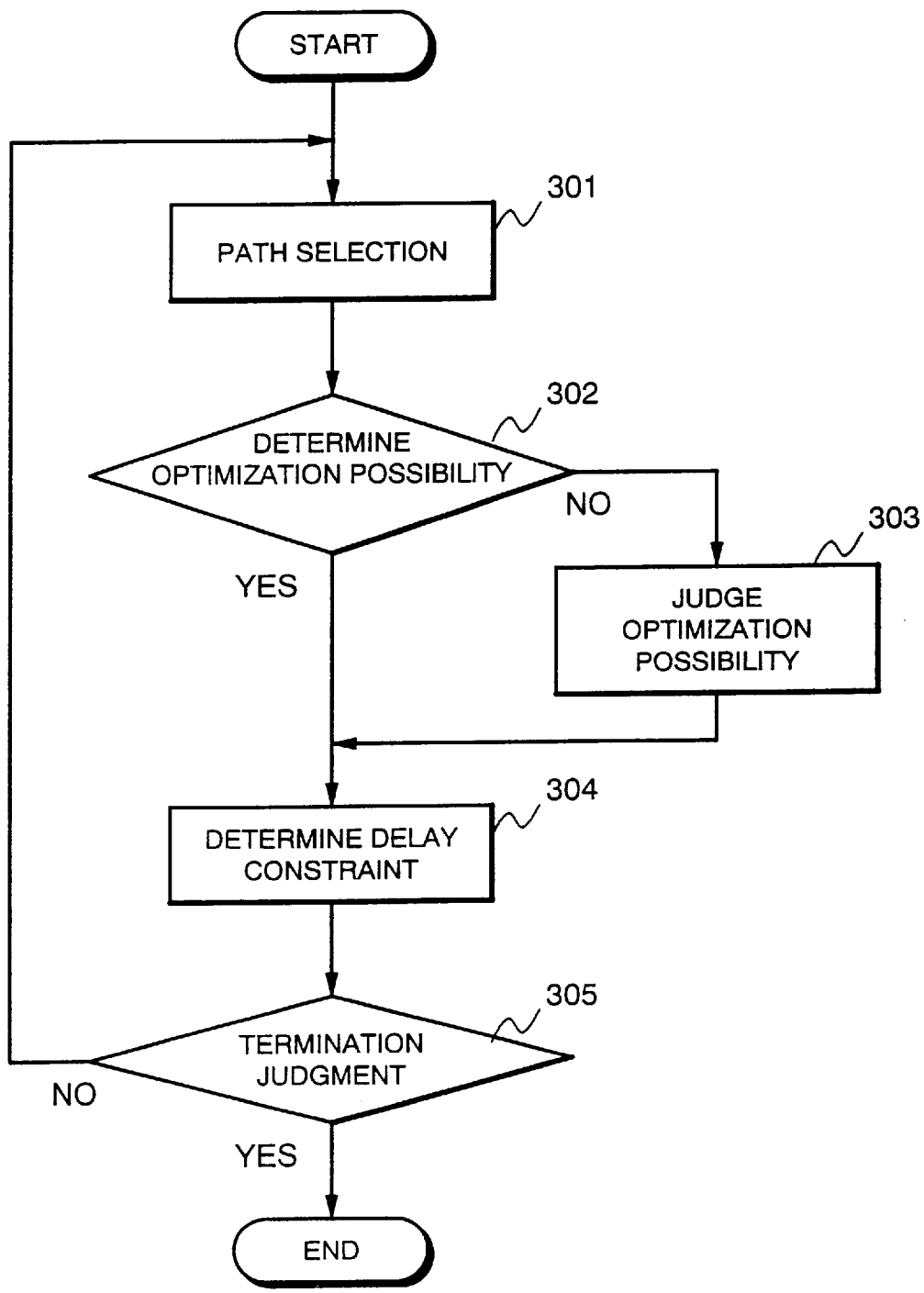
FIG. 3 is a flowchart showing the processing by a delay constraint distributor (timing budgeter) unit according to the first embodiment.

The delay constraint distributor 50 distributes a delay constraint to the path which extends over hierarchical sub-circuits (step 205). FIG. 3 shows the details of processing by the delay constraint distributor 50. Referring to FIG. 3, among the paths which are to be processed but have not through the constraint distribution processing, a path having the minimum slack is taken out (step 301). Then, it is determined whether or not optimization possibility has been set for the partial combinational circuit and wiring of the path which extends over hierarchical sub-circuits, and if the setting has not been made yet, optimization possibility is set (steps 302, 303).

Figure 4:
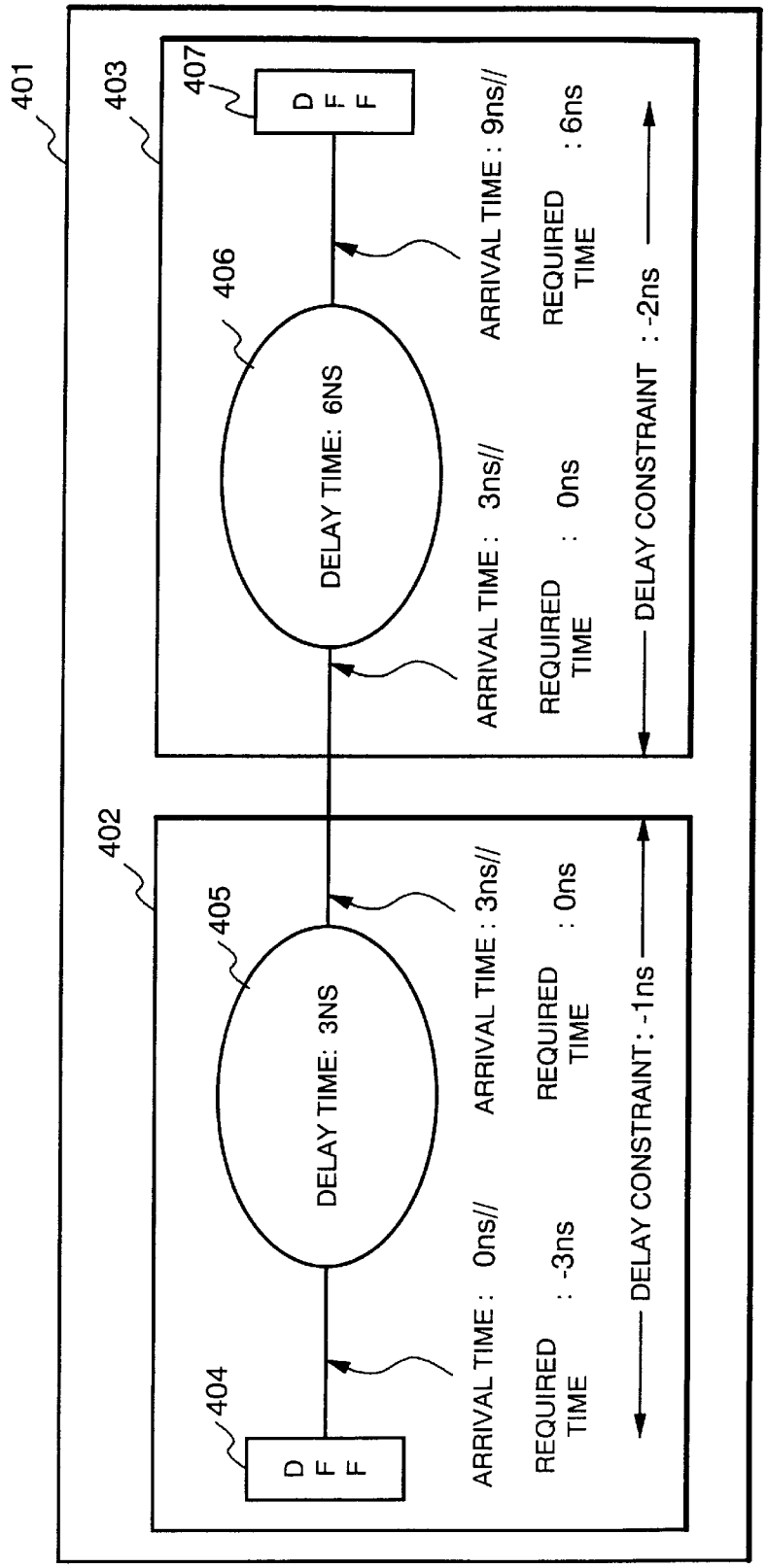
FIG. 4 is a circuit diagram showing an example of determining the delay constraints of a logic circuit according to the first embodiment.

The optimization possibility setting process will be described with reference to FIG. 4 which shows an example of the constraints distribution to the logic circuit. In the drawing, a higher hierarchical sub-circuit 401 has lower hierarchical sub-circuits 402, 403, the lower hierarchical sub-circuit 402 includes DFF 404 and a combinational circuit 405, and the lower hierarchical sub-circuit 403 includes DFF 407 and a combinational circuit 406. A subject path starts from the output pin of DFF 404, goes out of the hierarchical sub-circuit 402 through the combinational circuit 405, enters the hierarchical sub-circuit 403, and terminates at the input pin of DFF 407 through the combinational circuit 406. The delay constraints are not distributed to the wiring but to the combinational circuits 405, 408.

In order to simplify the model, the setup hold time, clock skew, distinction between rising and falling, maximum delay, minimum delay and wiring delay time of DFF are disregarded. It is assumed that the delay times of the combinational circuits 405, 406 are 3 ns and 6 ns, respectively. When the arrival time at the output pin of DFF 404 is 0 ns and the required time at the input pin of DFF407 is 6 ns, the arrival time at the output pins of the combinational circuits 405 and 406 become 3 ns and 9 ns, respectively. When it is assumed that the delays of the combinational circuits 405, 406 can be shortened by ⅓ from the current delay times, the optimization possibility is 1 ns for the combinational circuit 405 and 2 ns for the combinational circuit 406. The optimization possibility is calculated by various types of methods. Some examples will be described below.

In a first method which calculates from a given ratio with respect to a delay time when synthesis is performed with priority on an area, the optimization possibility is expressed by the following equation.

Optimization possibility=α*(delay time when synthesis is performed with priority on an area)+β  (1)

where, α and β represent a coefficient to indicate a ratio which can be shortened from the current delay time and can be determined from statistics of lots of data by experiment. They are not required to be a constant value in the circuit. The same is applied to the following equation.

In a second method which predicts the possibility for a similar circuit on the basis of the optimization possibility for an existing circuit, the optimization possibility is expressed by the following equation.

$$\text{Optimization possibility} = \alpha*(\text{prediction based on existing circuit}) + \beta \quad (2)$$

In a third method which predicts in view of the complexity of logic and fan-out, the optimization possibility is expressed by the following equation.

$$\text{Optimization possibility} = \alpha * \{a*(\text{complexity of logic}) + b*(\text{fan-out})\} + \beta \quad (3)$$

where, a and b represent a coefficient when a delay is predicted; a represents contribution to a delay time with respect to the complexity of logic, and b represents contribution to a delay time with respect to the fan-out. In the above examples, the optimization possibility has been indicated by a linear expression but may be expressed by a more complex function. It is also possible to take an area and power consumption overhead into the optimization possibility. In such a case, the equation (1) may be expanded to as shown below.

$$\text{Optimization possibility} = \alpha*(\text{delay time when synthesis is performed with priority on an area})/(1 + \gamma*(\text{area increase ratio})) + \beta \quad (4)$$

where, $\gamma$ is a coefficient with the area increase ratio taken into account. When $\gamma=0$, the equation (4) becomes the same as the equation (1), and the area increase is not taken into account. Thus, the optimization possibility can be calculated with the area increase ratio of the partial path taken into account. In the same way, the power consumption overhead can also be considered.

After determining the optimization possibility as described above, the delay constraint is set for the combinational circuit on the subject path (step 304). By the setting process of the delay constraints, the delay constraints determined from the output pin of DFF 404 to the output terminal of the hierarchical sub-circuit 402 and from the input terminal of the hierarchical sub-circuit 403 to the input pin of DFF 407, namely the delay constraints to be determined for the combinational circuits 405, 406 is represented by the following equation.

$$\text{Delay constraint} = (\text{remained slacks})*(\text{optimization possibility})/\Sigma(\text{optimization possibility}) \quad (5)$$

The remained slacks are calculated by the following equation.

$$\text{Remained slacks} = \{(\text{required time at end point}) - (\text{arrival time at end point})\} - \Sigma(\text{distributed constraint}) \quad (6)$$

where, $\Sigma$ (distributed constraint) is a total of constraints allocated to a given partial path in the repeated processing shown in FIG. 3, and $\Sigma$ (optimization possibility) is a total of the optimization possibilities of all partial paths on the path to which the delay constraints are distributed. In the example shown in FIG. 4, $\Sigma$ (distributed constraint) is 0, so that the delay constraints to the combinational circuit 405 is expressed as follows according to the equation (5).

$$(6-9) * 1/(1+2) = -3 * 1/3 = -1$$

And, the delay constraints to the combinational circuit 406 is expressed as follows.

$$(6-9) * 2/(1+2) = -3 * 2/3 = -2$$

Thus, the delay constraints are determined so that the combinational circuit 405 shall be shortened by 1 ns and the combinational circuit 406 by 2 ns. The above description has been made on the case that the combinational circuit in one hierarchical sub-circuit on the path is only one, but the delay constraints can be distributed in the same way by the equation (6) above even when there are multiple combinational circuits. Generally, the constraint is distributed with a set of blocks larger than the primitive element block, e.g., blocks forming a tree structure, as a unit of a single combinational circuit.

After setting the required delay constraints, the processing by the delay constraint distributor 50 is terminated when the processing of all subject paths has been completed (step 305). If it is found by the termination judgment that there is any unprocessed path, the procedure goes back to step 301, and the next path is selected to repeat the same procedure. The optimization possibility is a numerical value which indicates a possibility and does not assure its realization. The coefficients $\alpha$, $\beta$ in the equations (1) to (4) may be a value with an allowance to some extent with respect to the statistically obtained values.

After terminating the process (step 205) by the delay constrain distributor 50, the optimizing unit 60 performs the delay optimization of the logic circuit stored in the circuit database 30 for each hierarchical sub-circuit having the delay constraints distributed according to the delay constraints determined in step 205 (step 206). The optimized logic circuit is stored in the circuit database 30.

Then, in order to judge whether or not the optimized result is good, the procedure returns to the processing in step 204 by the timing analyzer 40. At the time, the timing analysis is incrementally performed on the partial circuit which was changed by the optimization and a part which is influenced by the pertinent partial circuit, so that the processing can be made faster.

When the timing analysis results in judging that there are not any constraint violation paths or no more optimization can be made, the output 90 outputs the optimized logic circuit stored in the circuit database 30 (steps 207, 208).

Since the delay constraints are also distributed to a path which is not critical as described above, the optimizing unit 60 performs the processing in step 206 so that the circuit area and power consumption can be reduced by using a low power block within a range not violating the delay constraint. In this case, the delay constraints to be distributed does not mean a delay time which must be shortened but a delay margin time which allows to delay.

Now, description will be made of the logic circuit optimization apparatus according to a second embodiment of the invention.

Figure 5:
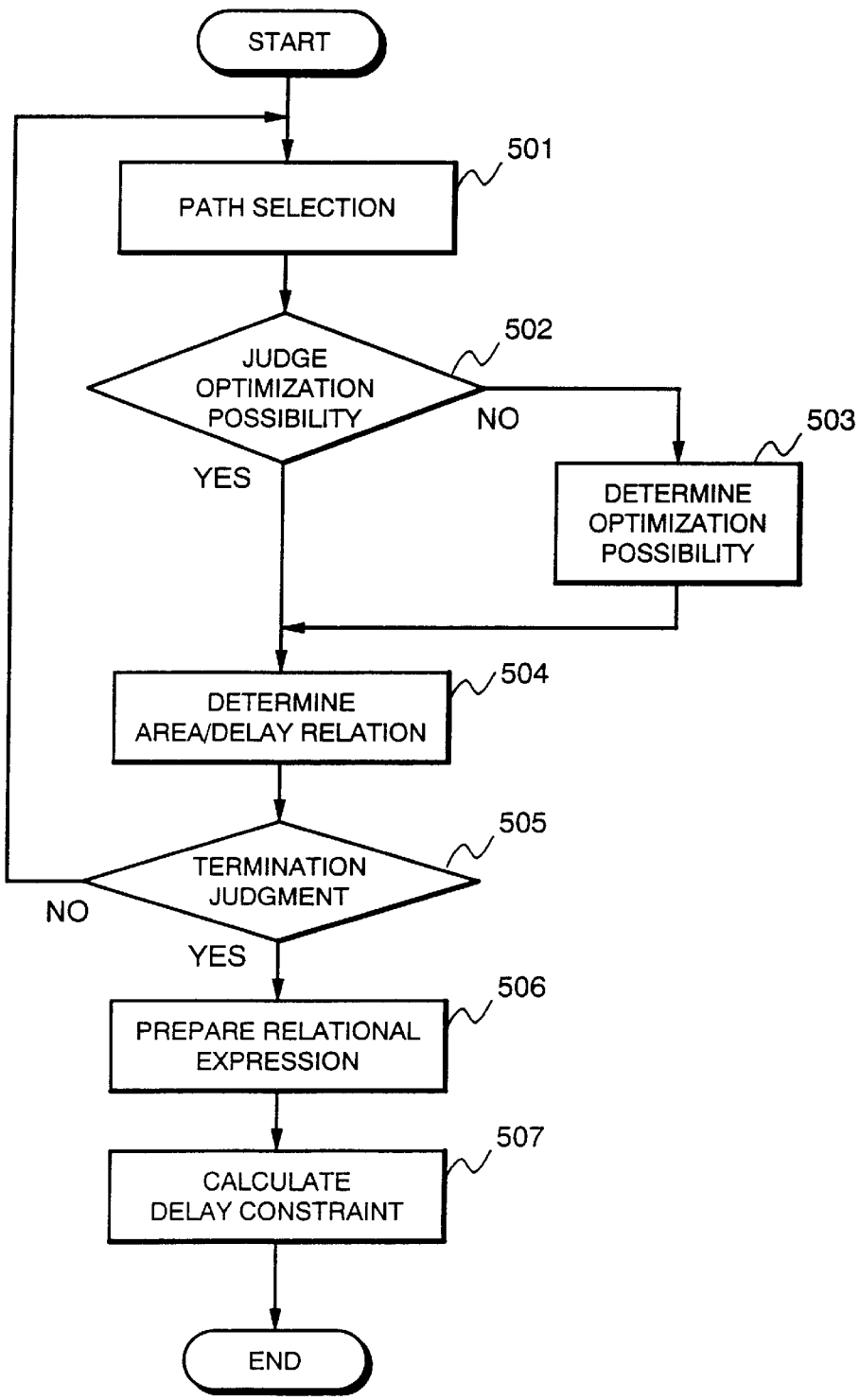
FIG. 5 is a flowchart showing the processing by the delay constraints distributor unit mounted on the logic circuit optimization apparatus according to a second embodiment of the present invention.

The optimization apparatus according to the second embodiment is configured in the same way as the optimization apparatus according to the first embodiment shown in FIG. 1. As described in the first embodiment with reference to FIG. 3, the delay constraint distributor 50 distributes the delay constraints to respective paths in the order of their increasing slacks, but in this embodiment, it distributes the delay constraints by taking an area increase ratio into account. FIG. 5 shows the processing performed by the delay constraint distributor 50 in this embodiment.

Referring to FIG. 5, the operations from step 501 to step 503 to select a path and to set the optimization possibility are the same as those from step 301 to step 303 in the first embodiment shown in FIG. 3. But, in step 501, it is not necessary to select the slacks in the order of their increasing slacks like the first embodiment, and the paths may be selected under arbitrary conditions.

After determining the optimization possibility, when it is assumed that the delay constraint is $e^i_j$ with respect to each partial path "j" on a prescribed path "i" in step 504 for area/delay relation setting, an area increase ratio $a^i_j$ owing to satisfaction of the pertinent delay constraint can be expressed by the following linear expression. The delay constraint $e^i_j$ to be distributed is indicated in a negative value as long as it violates the constraint.

$$a^i_j = k * e^i_j + h \tag{7}$$

where, k and h are coefficients and can be determined from statistics of lots of data by experiment. They are not required to be a constant value in the circuit.

After determining the relation between the area and the delay, it is judged whether or not the processing has been completed on all subject paths, and if there is any unprocessed path, the procedure returns to step 501, the next path is selected, and the same processing is repeated (step 505).

When the processing has completed on all paths, the following relational expression is prepared (step 506). Specifically, the delay optimization possibility of each partial path j is assumed to be $d^i_j$ with respect to each path i, then the expression is as follows.

$$-e^i_j \leq d^i_j \tag{8}$$

And, when the delay constraint of a path, namely a slack, is $s^i$, the delay constraint is distributed so that the following expression is derived. And, when the optimization is completed as constrained, the constraint violation of the path i is resolved.

$$\sum_j e^i_j \leq s^i \tag{9}$$

Under the conditions of the above expressions (7), (8) and (9), linear programming is used to solve so that the following expression (10) results in the minimum, thereby determining the delay constraint $e^i_j$ of each partial path.

$$\sum_i \sum_j a^i_j \tag{10}$$

As described above, the delay constraint distribution with the least area increase was performed based on the relation between the area increase ratio and the delay constraints, but it is also possible to perform the delay constraints.

Now, description will be made of the logic circuit optimization apparatus according to a third embodiment.

Figure 6:
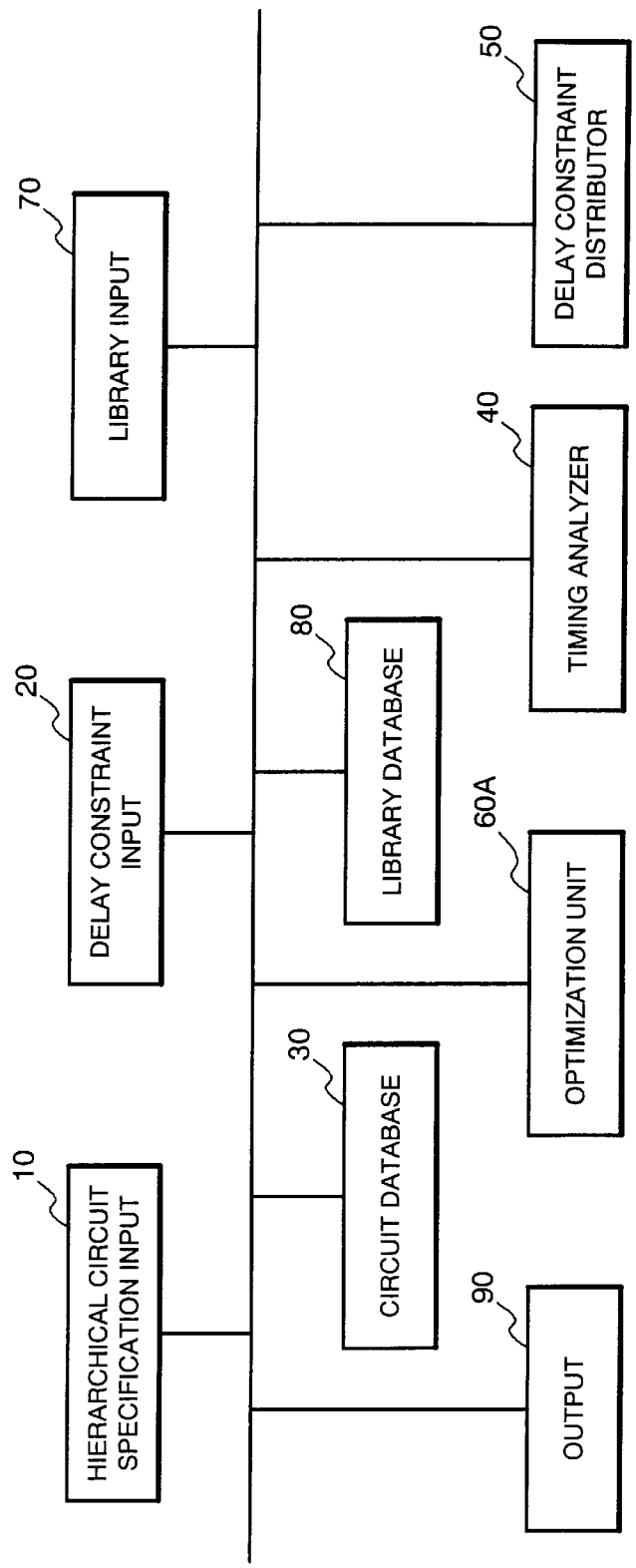
FIG. 6 is a block diagram showing the configuration of the logic circuit optimization apparatus according to the second embodiment of the present invention.

FIG. 6 is a block diagram showing the configuration of the optimization apparatus according to this embodiment. It is seen that the optimization apparatus according to this embodiment has almost the same configuration as the optimization apparatus according to the first embodiment shown in FIG. 1. An optimization unit 60A is different from the optimization unit 60 according to the first embodiment shown in FIG. 1 which performs the delay optimization by the conversion of the logic circuit according to the logic synthesis method, and performs the delay optimization not only by the logic synthesis method but also by performing a floor plan of each hierarchy on an LSI.

The wiring delay can be shortened by making the wiring length between hierarchical sub-circuits as short as possible when the logic circuit is formed on an LSI chip for every hierarchical sub-circuit. In other words, the delay optimization can be performed by allocating the delay constraints to relatively long wiring, e.g., a wiring portion between hierarchical sub-circuits and changing the floor plan.

Figure 7:
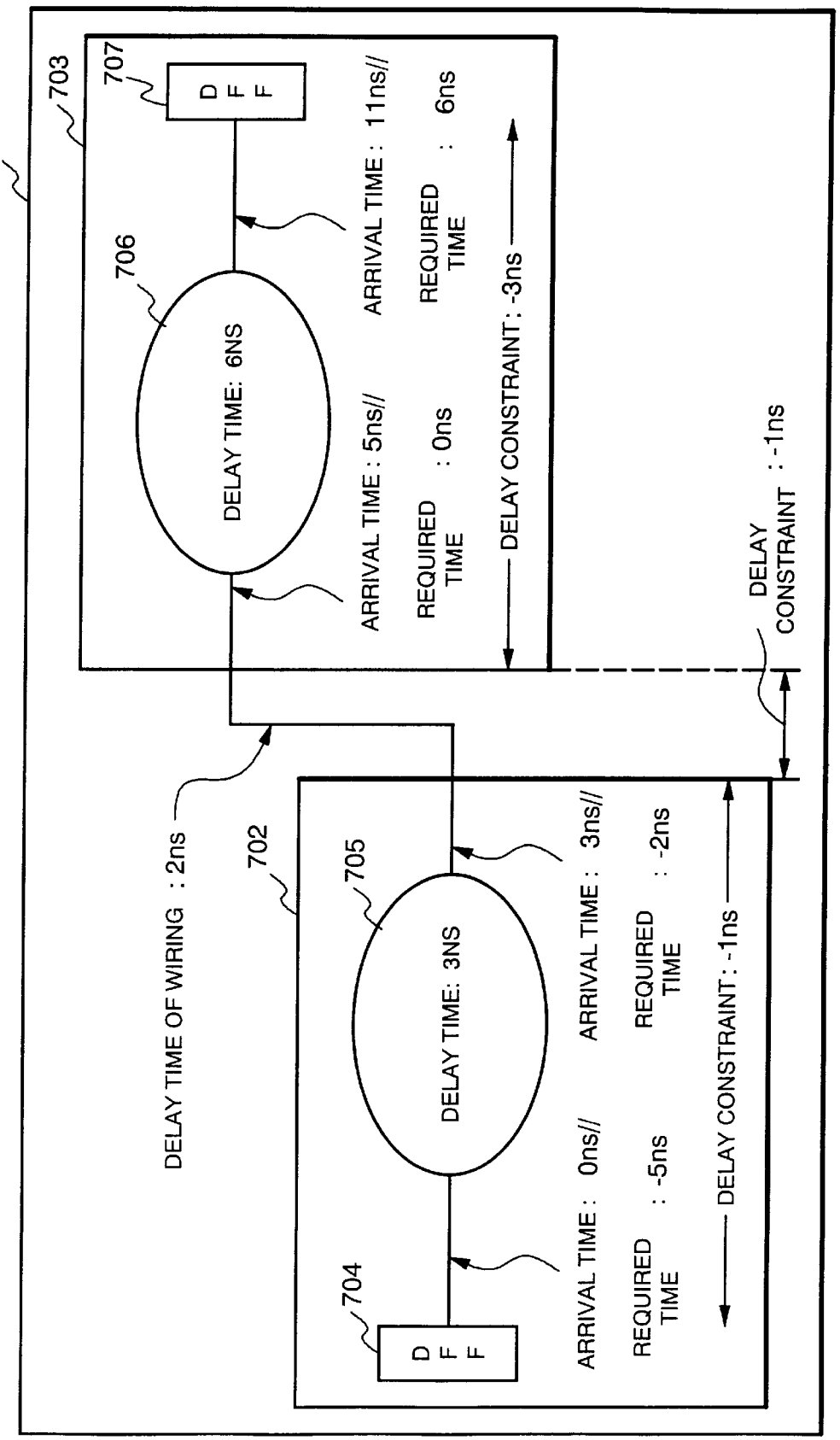
FIG. 7 is a circuit diagram showing an example of determining the delay constraint of a logic circuit according to a third embodiment.
Figure 8:
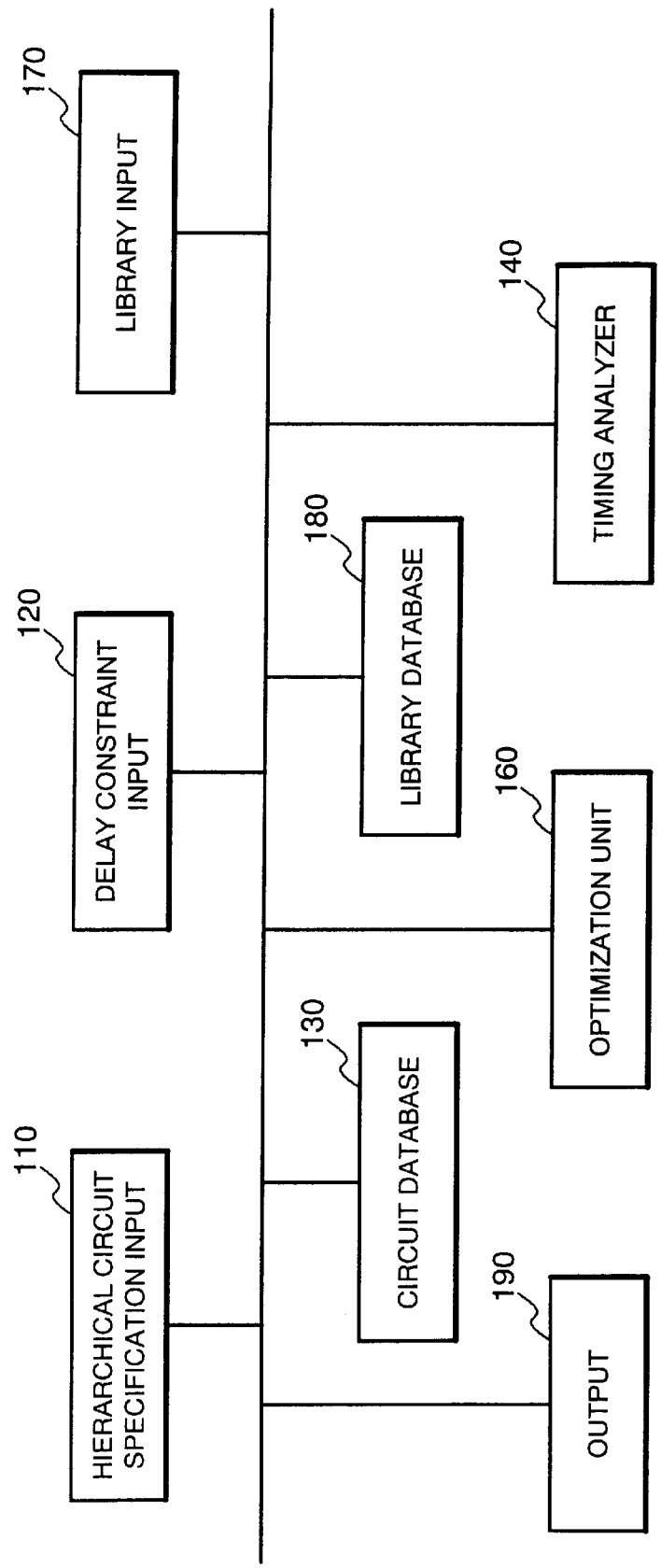
FIG. 8 is a block diagram showing the configuration of a conventional logic circuit optimization apparatus.
Figure 9:
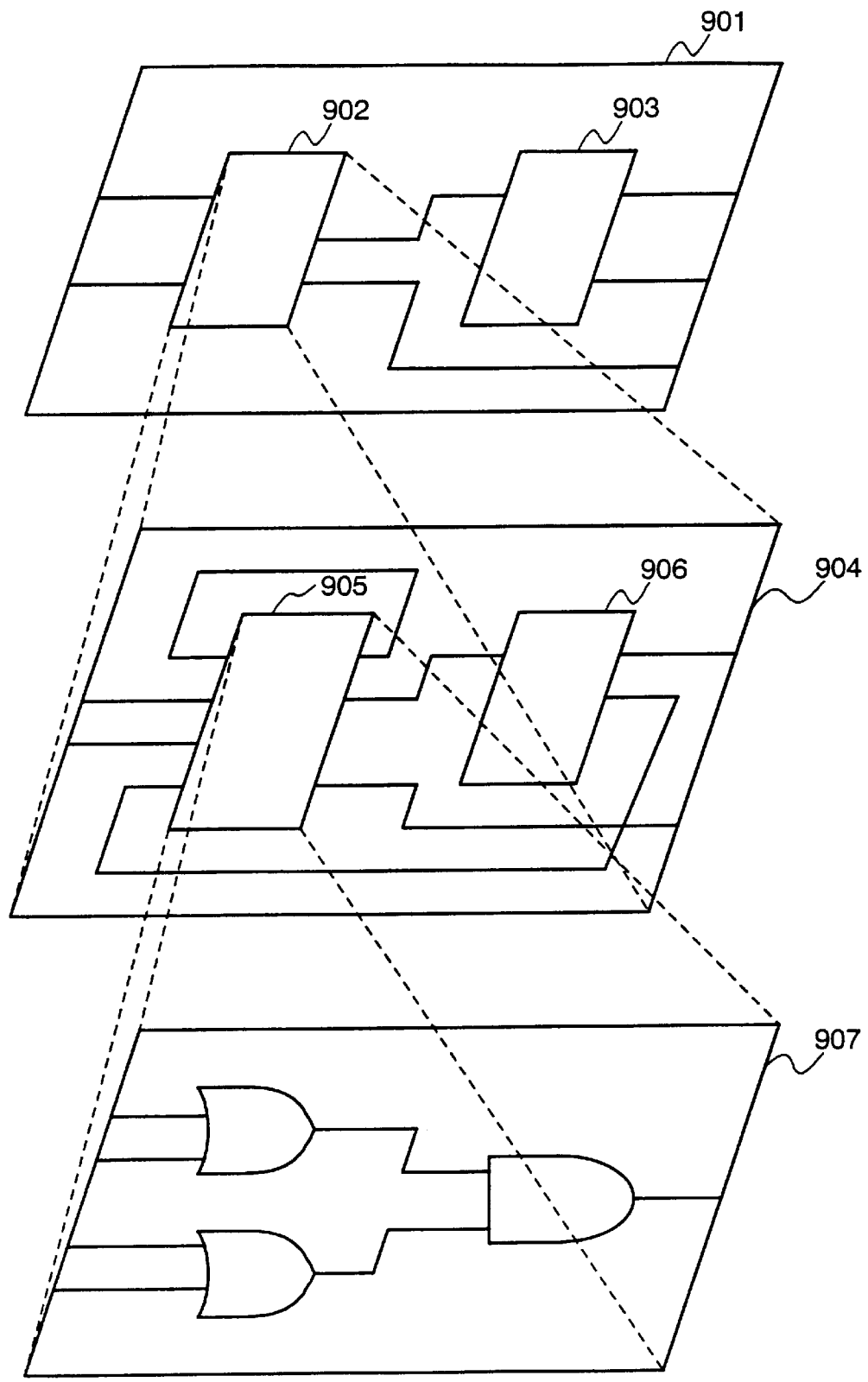
FIG. 9 is a diagram showing the configuration of a logic circuit having a hierarchical structure.
Figure 10:
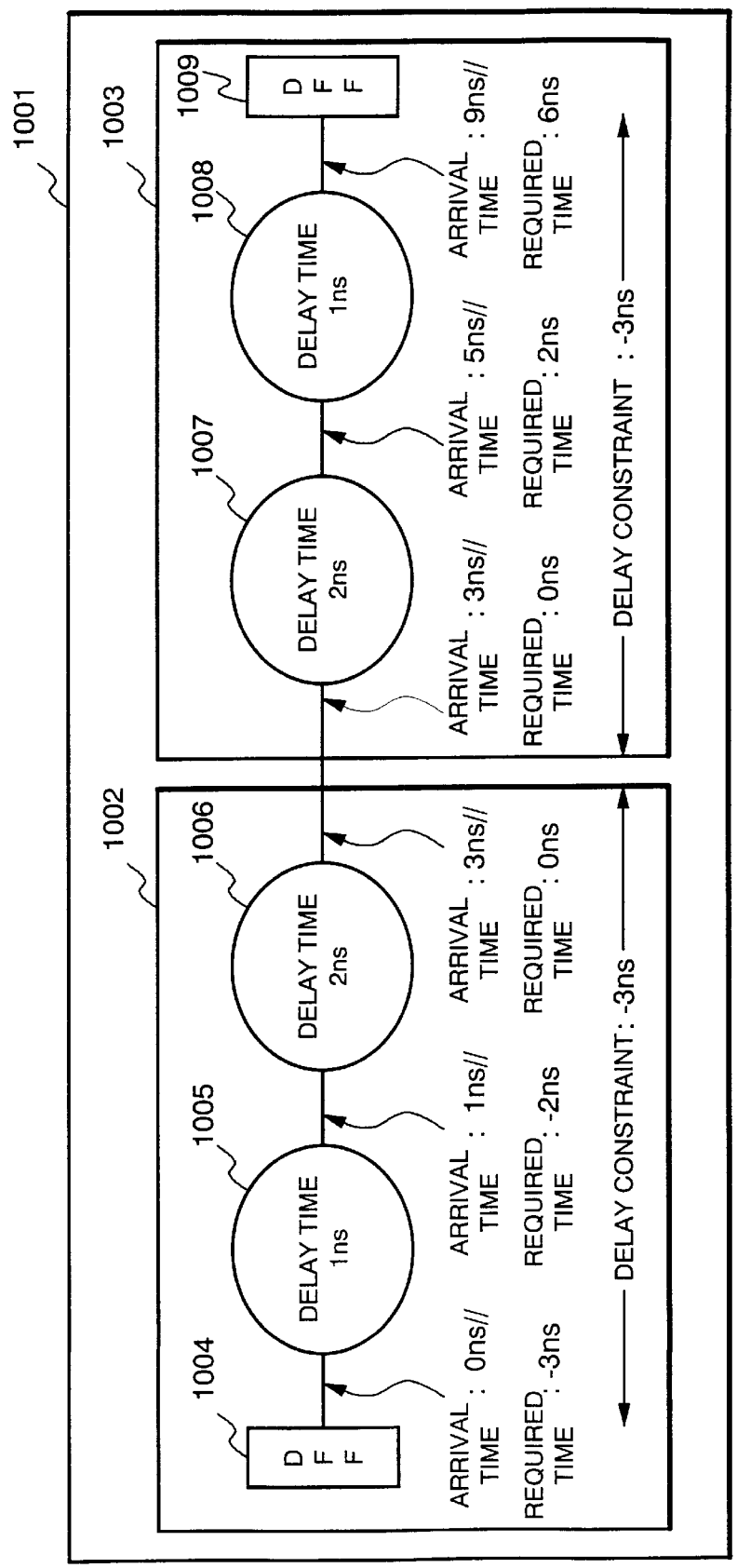
FIG. 10 is a circuit diagram showing an example of determining the delay constraint of a logic circuit by a conventional optimization apparatus.

FIG. 7 shows an example of the logic circuit having the delay constraints allocated to a wiring portion. Referring to FIG. 7, differences from the constraint distribution shown in FIG. 4 include that the wiring delay between a hierarchical sub-circuit 702 and a hierarchical sub-circuit 703 is 2 ns and a delay constraint of −1 ns is determined according to the optimization possibility of the pertinent wiring delay.

Besides, the wiring delay is often expressed by functions including parameters such as the drive performance of the output pin of a block, dullness of the input signal, and a total of a wiring capacity at a target fan-out and an input pin capacity. And, it is known that in designing an LSI, a wiring resistance has a large effect on the wiring delay time with respect to a relatively long wiring, a deep submicron designs. And, it is known that the wiring delay time with the wiring resistance taken into account is proportional to the square of the wiring length if a branch or the shape of the wiring is disregarded. Therefore, when it is known in advance in view of a floor plan that wiring is relatively long between hierarchical sub-circuits, it is also possible to distribute the delay constraint to the wiring portion with the delay optimization by inserting buffers or inverters taken into account.

The delay optimization shortens the delay time related to the wiring resistance by inserting at least buffers or inverters for equally dividing a long wiring. To insert inverters, it is necessary to insert it in an even number so that logic on the wiring does not invert. But, it is necessary to appropriately make the division of wiring and insertion because the internal delay of the buffer or inverter to be inserted and the input pin capacity are also increased.

As described above, the logic circuit optimization apparatus and its method according to the present invention have an effect of enabling the optimization processing in a good balance by performing the delay constraint distribution processing for distributing the delay constraints to respective hierarchical sub-circuits and wiring which configure the logic circuit according to the optimization possibility of each partial path. Thus, it is possible to prevent a disadvantage of a conventional technique that the optimized result is very poor in balance depending on the order of selecting hierarchical sub-circuits to be optimized. And, it is also possible to remove the causes of increasing the circuit area and to prevent the processing time from increasing by the repeated processing for optimization.

And, since the optimization processing itself is performed without deploying the hierarchical structure of the logic circuit, it does not take place that the time required for the optimization processing becomes long because the circuit to be optimized becomes large and the terminal of the original hierarchical sub-circuit can not be restored because the blocks at the boundary of hierarchical sub-circuit disappear as the optimization result.

In addition, since the optimization using a floor plan and the optimization by inserting a buffer or inverter into the wiring between hierarchical sub-circuits are performed in addition to the optimization within the hierarchical sub-circuit by the logic synthesis as the delay optimization methods, it is effective that the delay optimization suitable for the pertinent logic circuit can be selected and a logic circuit having a small required area and a large operation frequency can be designed effectively.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. An optimization apparatus for optimizing a logic circuit having a hierarchical structure, comprising:

a hierarchical circuit specification input means for entering a logic circuit having a hierarchical structure;

a delay constraint input means for entering a delay constraint which is provided by prescribed information indicating the constraint conditions of delay time in the entered logic circuit;

a circuit database means for storing and holding the entered logic circuit and delay constraints;

a timing analysis means for performing the timing analysis of said logic circuit held by said circuit database means;

a delay constraint distribution means for distributing said delay constraints to respective hierarchical sub-circuits configuring said logic circuit according to the optimization possibility of said logic circuit held by said circuit database means;

an optimization means for performing the delay optimization of said logic circuit according to said delay constraints which are distributed to the respective hierarchical sub-circuits of said logic circuit by said delay constraint distribution means;

a library input means for entering library information to be used for the timing analysis of said logic circuit;

a library database means for holding the entered library information; and an output means for outputting the optimized logic circuit.

2. The logic circuit optimization apparatus as set forth in claim 1, wherein said delay constraint distribution means selects paths in order of their increasing slacks from the paths configuring the logic circuit or its partial circuit to be processed, determines the optimization possibility of combinational circuits on said paths, and determines the delay constraint for each of said combinational circuits according to said optimization possibility.

3. The logic circuit optimization apparatus as set forth in claim 1, wherein said delay constraint distribution means selects paths sequentially under prescribed conditions from the paths configuring the logic circuit or its partial circuit to be processed, determines the optimization possibility of a combinational circuit on said paths, takes into account the relation between an increase ratio of the circuit area and a delay time to be decreased when said combinational circuit is optimized, and determines the delay constraint so that the increase of said circuit area becomes minimum.

4. The logic circuit optimization apparatus as set forth in claim 1, wherein said delay constraint distribution means distributes said delay constraint to the respective hierarchical sub-circuits and wiring configuring said logic circuit, and said optimization means optimizes said logic circuit for the respective hierarchical sub-circuits and also minimizes the delay time of wiring between said hierarchical sub-circuits according to a floor plan which shows a layout of the respective hierarchical sub-circuits configuring said logic circuit.

5. The logic circuit optimization apparatus as set forth in claim 1, wherein said delay constraint distribution means selects paths in order of their increasing slacks from the paths configuring the logic circuit or its partial circuit to be processed, determines the optimization possibility of combinational circuits on said paths, determines the delay constraints for each of said combinational circuits according to said optimization possibility, and determines the delay constraints on the wiring between the combinational circuits and between the hierarchical sub-circuits according to a floor plan which shows a layout of the respective hierarchical sub-circuit configuring said logic circuit; and said optimization means optimizes said logic circuit for the respective hierarchical sub-circuit and also minimizes the delay time of wiring between said hierarchical sub-circuit according to said floor plan.

6. The logic circuit optimization apparatus as set forth in claim 1, wherein said delay constraint distribution means selects paths sequentially under prescribed conditions from the paths configuring the logic circuit or its partial circuit to be processed, determines the optimization possibility of combinational circuits on said paths, takes into account the relation between an increase ratio of the circuit area and a delay time to be decreased when said combinational circuits are optimized, determines the delay constraints so that the increase of said circuit area becomes minimum, and determines the delay constraints on the wiring between the combinational circuits and between the hierarchical sub-circuits according to a floor plan which shows a layout of the respective hierarchical sub-circuits configuring said logic circuit; and said optimization means optimizes said logic circuit for the respective hierarchical sub-circuits and also minimizes the delay time of wiring between said hierarchical sub-circuits according to said floor plan.

7. An optimization method for optimizing a logic circuit having a hierarchical structure, comprising the steps of:

a first step to enter a logic circuit having a hierarchical structure;

a second step to enter delay constraints given by prescribed information which shows the constraint conditions of delay time in the entered logic circuit;

a third step to perform a timing analysis of said entered logic circuit;

a fourth step to distribute said delay constraints to the respective hierarchical sub-circuits configuring said logic circuit according to the optimization possibility of said entered logic circuit;

a fifth step to perform the delay optimization of said logic circuit according to said delay constraints which are delivered to the respective hierarchical sub-circuit of said logic circuit; and a sixth step to output the logic circuit which has been optimized.

8. The logic circuit optimization method as set forth in claim 7, wherein said third step for distributing said delay constraint comprising:

a step to take out by selecting paths in order of their increasing slacks from the paths configuring the logic circuit or its partial circuit to be processed;

a step to determine whether or not the optimization possibility has been set for the combinational circuits on said taken paths;

a step to determine the optimization possibility when the optimization possibility has not been set for said combinational circuits; and a step to determine delay constraints for each of said combinational circuits according to said optimization possibility.

9. The logic circuit optimization method as set forth in claim 7, wherein said third step for distributing said delay constraint comprising:

a step to take out by selecting paths sequentially under arbitrary conditions from the paths configuring the logic circuit or its partial circuit to be processed;

a step to determine whether or not the optimization possibility has been set for the combinational circuits on said taken paths;

a step to determine the optimization possibility when the optimization possibility has not been set for said combinational circuits; and a step to take into account the relation between an increase ratio of the circuit area and a delay time to be decreased when said combinational circuits are optimized, and to determine the delay constraints so that the increase of said circuit area becomes minimum.

10. An optimization method for optimizing a logic circuit having a hierarchical structure, comprising the steps of:

a first step to enter a logic circuit having a hierarchical structure;

a second step to enter delay constraints given by prescribed information which shows the constraint conditions of delay time in the entered logic circuit;

a third step to perform a timing analysis of said entered logic circuit;

a fourth step to distribute said delay constraints to the respective hierarchical sub-circuits and respective wiring configuring said logic circuit according to the optimization possibility of said entered logic circuit;

a fifth step to perform the delay optimization of said logic circuit according to said delay constraints which are delivered to the respective hierarchical sub-circuits of said logic circuit; and a sixth step to output the logic circuit which has been optimized.

11. The logic circuit optimization method as set forth in claim 10, wherein said third step for distributing said delay constraints comprising:

a step to take out by selecting paths in order of their increasing slacks from the paths configuring the logic circuit or its partial circuit to be processed;

a step to determine whether or not the optimization possibility has been set for the combinational circuits and wiring on said taken paths;

a step to determine the optimization possibility when the optimization possibility has not been set for said combinational circuits or said wiring; and a step to determine delay constraints for each of said combinational circuits according to said optimization possibility.

12. The logic circuit optimization method as set forth in claim 10, wherein said third step for distributing said delay constraints comprising:

a step to take out by selecting paths sequentially under arbitrary conditions from the paths configuring the logic circuit or its partial circuit to be processed;

a step to determine whether or not the optimization possibility has been set for the combinational circuits and respective wiring on said taken paths;

a step to determine the optimization possibility when the optimization possibility has not been set for said combinational circuits or said wiring; and a step to take into account the relation between an increase ratio of the circuit area and a delay time to be decreased when said combinational circuits and said wiring are optimized, and to determine the delay constraint so that the increase of said circuit area becomes minimum.

13. A computer readable memory having a computer program for directing a computer to optimize a logic circuit having a hierarchical structure, said computer program comprising the steps for controlling the computer to:

enter a logic circuit having a hierarchical structure;

enter delay constraints given by prescribed information which shows the constraint conditions of delay time in the entered logic circuit;

perform a timing analysis of said entered logic circuit;

distribute said delay constraints to the respective hierarchical sub-circuits configuring said logic circuit according to the optimization possibility of said entered logic circuit;

perform the delay optimization of said logic circuit according to said delay constraints which are delivered to the respective hierarchies of said logic circuit; and output the logic circuit which has been optimized.

14. The computer readable memory as set forth in claim 13, wherein said step for distributing said delay constraints comprising the steps of:

take out by selecting paths sequentially under arbitrary conditions from the paths configuring the logic circuit or its partial circuit to be processed;

determine whether or not the optimization possibility has been set for the combinational circuits on said taken paths;

determine the optimization possibility when the optimization possibility has not been set for said combinational circuits; and take into account the relation between an increase ratio of the circuit area and a delay time to be decreased when said combinational circuits are optimized, and to determine the delay constraints so that the increase of said circuit area becomes minimum.

* * * * *